United States Patent
Zilleruelo-Ramos et al.

(10) Patent No.: US 10,614,486 B2
(45) Date of Patent: Apr. 7, 2020

(54) GRAPH-BASED COMPRESSION OF DATA RECORDS

(71) Applicant: Groupon, Inc., Chicago, IL (US)

(72) Inventors: Ricardo A. Zilleruelo-Ramos, Mountain View, CA (US); Hernan Enrique Arroyo Garcia, Mountain View, CA (US); Joe Frisbie, Seattle, WA (US); Gaston L'Huillier, San Francisco, CA (US); Francisco Jose Larrain, Palo Alto, CA (US)

(73) Assignee: GROUPON, INC., Chicago, IL (US)

( * ) Notice: Subject to any disclaimer, the term of this patent is extended or adjusted under 35 U.S.C. 154(b) by 0 days.

(21) Appl. No.: 16/392,255

(22) Filed: Apr. 23, 2019

(65) Prior Publication Data

US 2019/0303965 A1 Oct. 3, 2019

Related U.S. Application Data

(63) Continuation of application No. 16/050,986, filed on Jul. 31, 2018, now Pat. No. 10,311,471, which is a continuation of application No. 15/449,687, filed on Mar. 3, 2017, now Pat. No. 10,062,089, which is a continuation of application No. 15/144,977, filed on May 3, 2016, now Pat. No. 9,619,823, which is a continuation of application No. 14/727,591, filed on Jun. 1, 2015, now Pat. No. 9,355,114.

(60) Provisional application No. 62/017,158, filed on Jun. 25, 2014.

(51) Int. Cl.
| | |
|---|---|
| G06Q 30/02 | (2012.01) |
| H03M 7/30 | (2006.01) |
| G06F 16/951 | (2019.01) |
| G06F 16/174 | (2019.01) |
| G06F 16/22 | (2019.01) |
| G06F 16/955 | (2019.01) |

(52) U.S. Cl.
CPC ..... *G06Q 30/0246* (2013.01); *G06F 16/1744* (2019.01); *G06F 16/2282* (2019.01); *G06F 16/951* (2019.01); *G06F 16/955* (2019.01); *H03M 7/30* (2013.01); *H03M 7/70* (2013.01)

(58) Field of Classification Search
None
See application file for complete search history.

(56) References Cited

U.S. PATENT DOCUMENTS

| | | |
|---|---|---|
| 6,175,835 B1 | 1/2001 | Shadmon |
| 7,818,303 B2 | 10/2010 | Buehrer et al. |
| 8,103,599 B2 | 1/2012 | Gao et al. |
| 8,250,069 B2 | 8/2012 | Jandhyala |
| 9,355,114 B1 | 5/2016 | Zilleruelo-Ramos et al. |
| 9,619,823 B2 | 4/2017 | Zilleruelo-Ramos et al. |
| 2007/0061339 A1 | 3/2007 | Douglet et al. |
| 2008/0256060 A1 | 10/2008 | Chang et al. |
| 2010/0125614 A1 | 5/2010 | D Urso |

(Continued)

OTHER PUBLICATIONS

Boldi, et al., The Web Graph Framework I: Compression Techniques, Proc. of the Thirteenth International World Wide Web Conference, pp. 595-602, (2004).

(Continued)

*Primary Examiner* — Howard Williams
(74) *Attorney, Agent, or Firm* — Alston & Bird LLP

(57) ABSTRACT

In general, embodiments of the present invention provide systems, methods and computer readable media for data record compression using graph-based techniques.

20 Claims, 11 Drawing Sheets

(56) References Cited

U.S. PATENT DOCUMENTS

| | | |
|---|---|---|
| 2011/0288931 A1 | 11/2011 | Kuhn et al. |
| 2012/0316961 A1 | 12/2012 | Evans et al. |
| 2013/0246300 A1 | 9/2013 | Fischer et al. |

OTHER PUBLICATIONS

U.S. Appl. No. 14/727,591, Notice of Allowance dated Jan. 29, 2016.

U.S. Appl. No. 16/050,986, filed Jul. 31, 2018, now U.S. Pat. No. 10,311,471.

U.S. Appl. No. 15/449,687, filed Mar. 3, 2017, now U.S. Pat. No. 10,062,089.

U.S. Appl. No. 15/144,977, filed May 3, 2016, now U.S. Pat. No. 9,619,823.

U.S. Appl. No. 14/727,591, filed Jun. 1, 2015, now U.S. Pat. No. 9,355,114.

Compressed Records

| User | Component | Unique Values | Repetitions (Index) | Value Positions (Non Index) |
|---|---|---|---|---|
| 999 | 1 | (3,4,5,6,7) | (0,2) (2,2) | --- |
| | 2 | (1,2) | --- | 1 -- 0, 2, 3<br>2 -- 1,4,5,6 |
| | 3 | (1,2,3,4) | --- | 1 -- 0,5<br>2 -- 1,2<br>3 -- 3,6<br>4 -- 4 |

FIG. 7A

Example Webgraph Compression Using Delta Encoding for an Unsorted List

| | |
|---|---|
| 3 5 3 4 5 4 4 1 2 2 1 4 | Example unsorted graph node list to be compressed |
| 1 2 3 4 5 | Sorted unique index values |
| 2 4 2 3 4 3 3 0 1 1 0 3 | Generate index value list by replacing unsorted list values with their respective unique index value list positions |
| 2 4 2 3 4 3 3 0 1 1 0 3<br>2 2 -2 1 1 -1 0 -3 1 0 -1 -3<br>4 4 3 2 2 1 0 5 2 0 1 5 | Encode index value list element values:<br>-- Subtract previous value from current value<br>-- Generate encoded value<br>  -- If difference is positive, multiply difference by 2<br>  -- If difference is negative, multiply its mod by 2 and subtract 2 |
| | Compress encoded index value list using delta encoding |

FIG. 7B

GRAPH-BASED COMPRESSION OF DATA RECORDS

CROSS-REFERENCE TO RELATED APPLICATIONS

This application is a continuation of U.S. application Ser. No. 16/050,986, entitled "GRAPH-BASED COMPRESSION OF DATA RECORDS", filed Jul. 31, 2018, and subsequently issued as U.S. Pat. No. 10,311,471 on Jun. 4, 2019, which is a continuation of U.S. application Ser. No. 15/449,687, entitled "GRAPH-BASED COMPRESSION OF DATA RECORDS", filed Mar. 3, 2017, and subsequently issued as U.S. Pat. No. 10,062,089 on Aug. 28, 2018, which is a continuation of U.S. application Ser. No. 15/144,977, entitled "GRAPH-BASED COMPRESSION OF DATA RECORDS", filed May 3, 2016, and subsequently issued as U.S. Pat. No. 9,619,823 on Apr. 11, 2017, which is a continuation of U.S. application Ser. No. 14/727,591, entitled "GRAPH-BASED COMPRESSION OF DATA RECORDS", filed Jun. 1, 2015, and subsequently issued as U.S. Pat. No. 9,355,114 on May 31, 2016, which claims the benefit of U.S. Provisional Application No. 62/017,158, entitled "GRAPH-BASED COMPRESSION OF DATA RECORDS", and filed Jun. 25, 2014, the entire contents of each of which are hereby incorporated by reference.

FIELD

Embodiments of the invention relate, generally, to webgraph-based techniques for compression of data.

BACKGROUND

An impression is a communication (e.g., a display or other indication including a mobile application and/or email) of a promotion which may be offered to a consumer by a promotion and marketing service. A promotion and marketing service may collect and store data associated with impressions; these data may be collected from data streams received from cross-platform data sources and stored in compound data records that include multiple data components.

Current methods for storing and accessing large amounts of data (e.g., impression data) exhibit a plurality of problems that make current systems insufficient, ineffective and/or the like. Through applied effort, ingenuity, and innovation, solutions to improve such methods have been realized and are described in connection with embodiments of the present invention.

SUMMARY

In general, embodiments of the present invention provide herein systems, methods and computer readable media for compression of data records using webgraph-based techniques. These data records may represent a variety of types of data sets (e.g., impression data, user location information, application logs). Embodiments in which the data records being compressed represent impression data are described here for clarity and without limitation of the invention.

The details of one or more embodiments of the subject matter described in this specification are set forth in the accompanying drawings and the description below. Other features, aspects, and advantages of the subject matter will become apparent from the description, the drawings, and the claims.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 6:
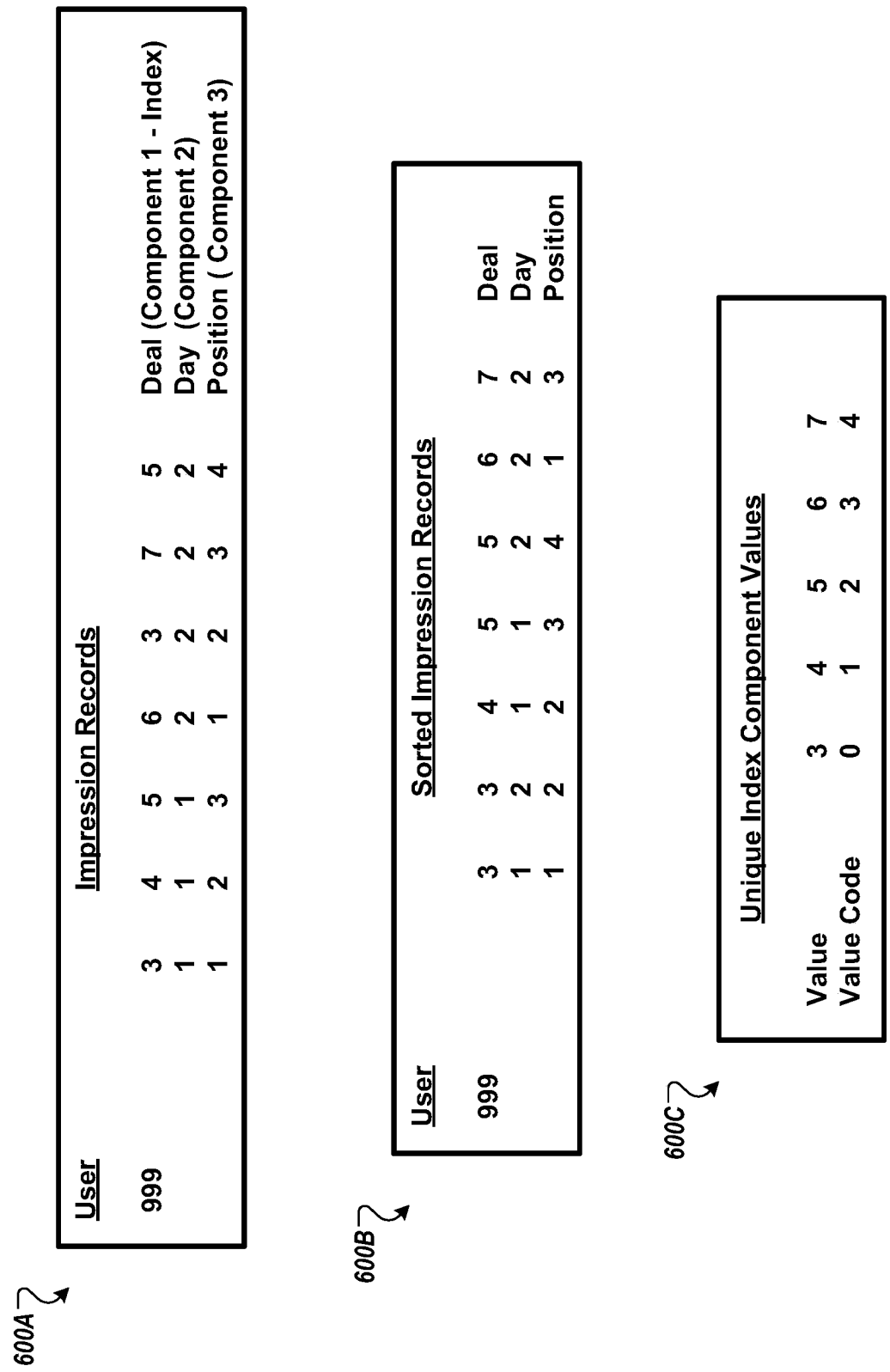
Figure 8:
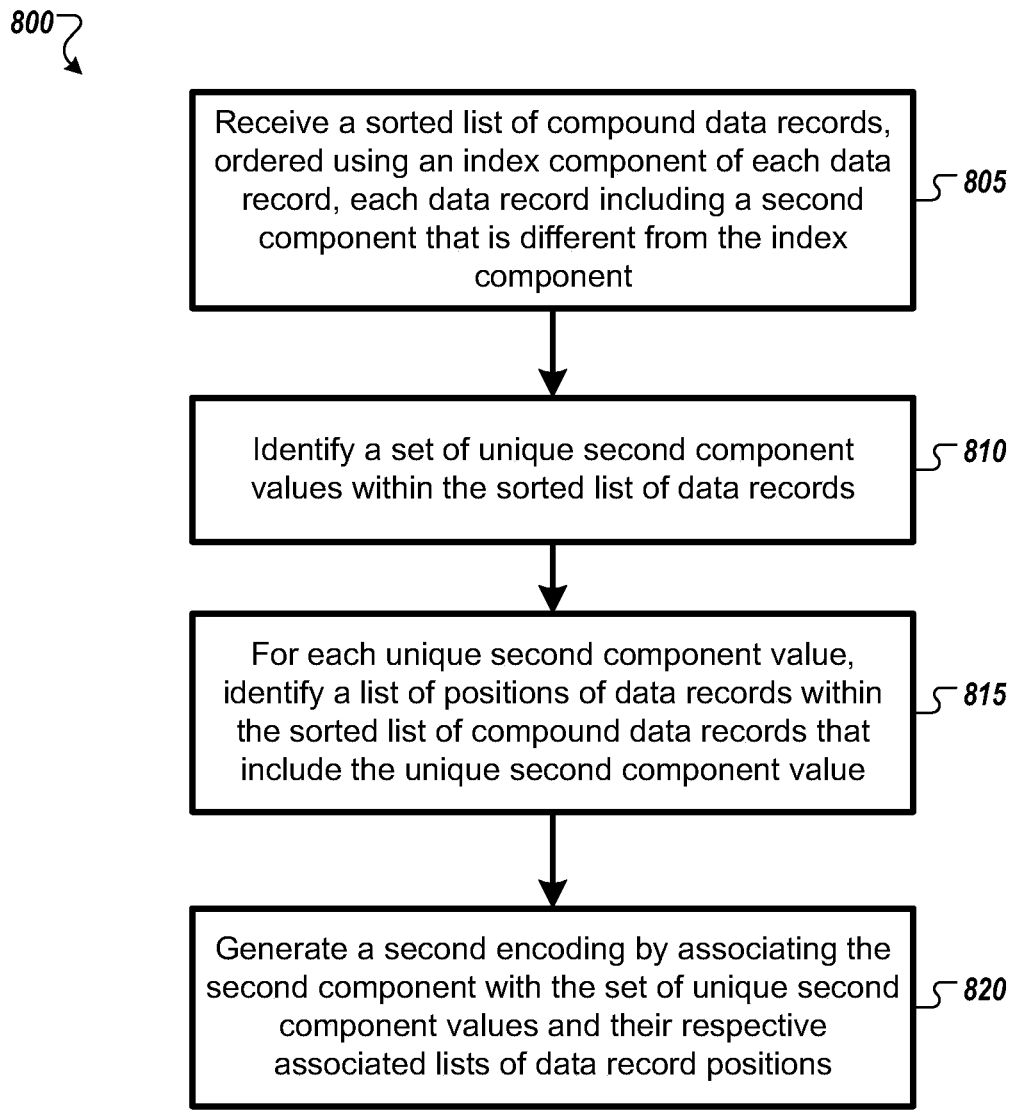
Figure 9:
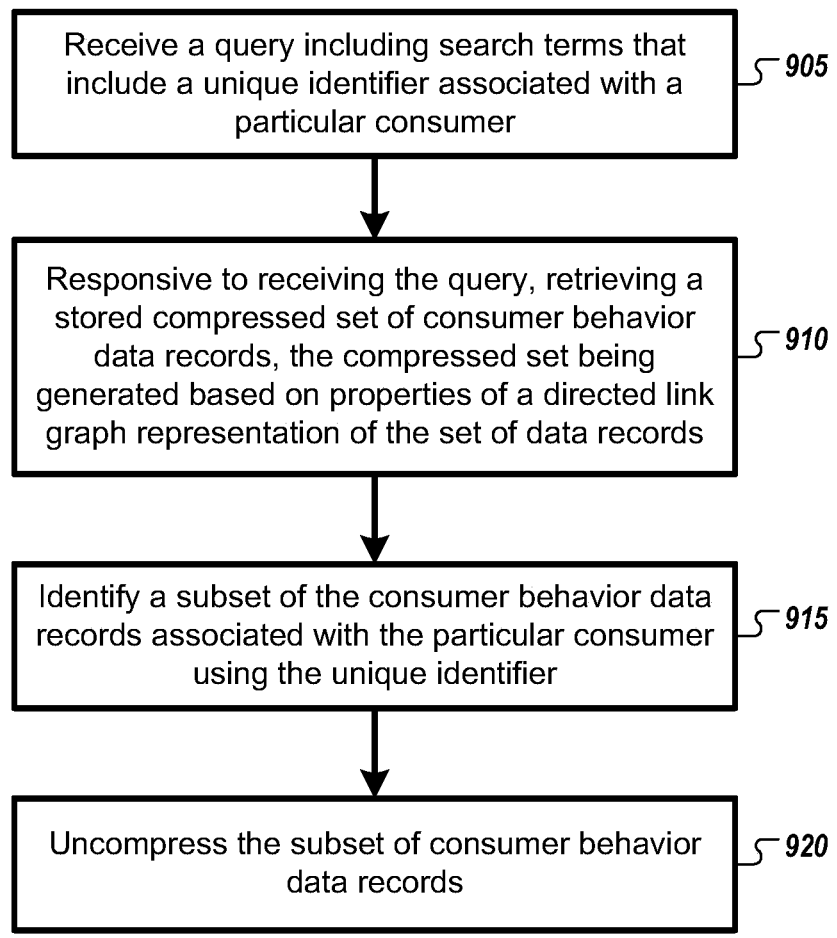
Figure 10:
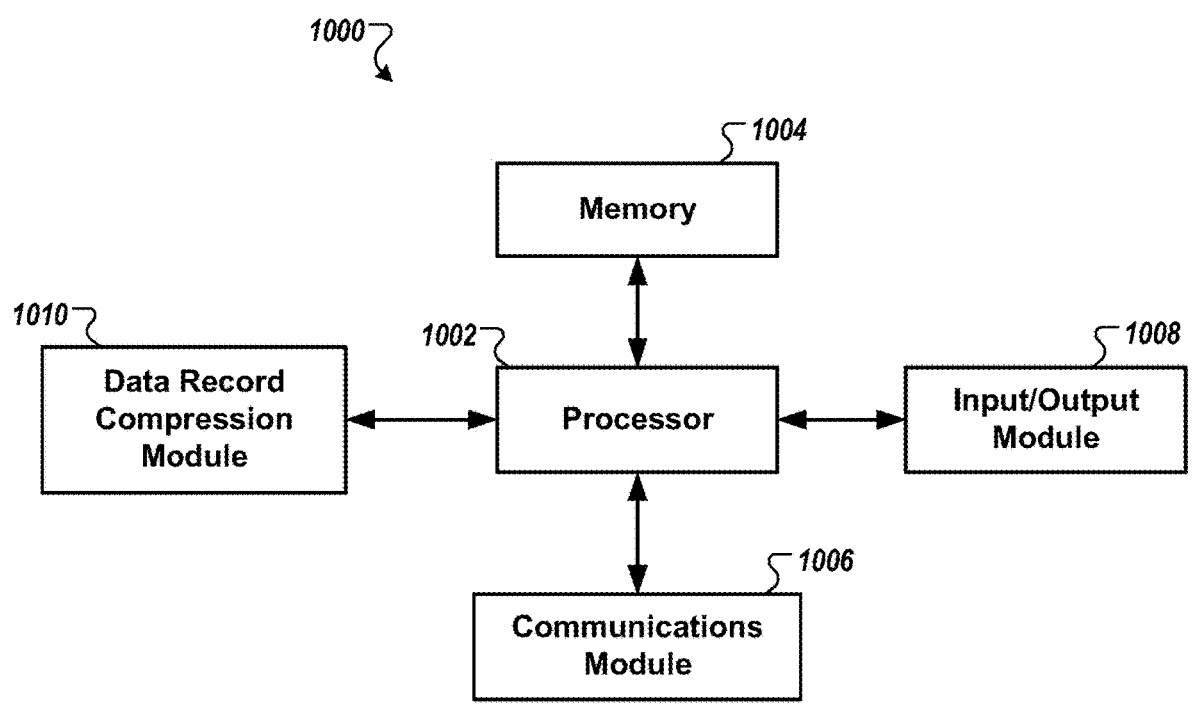

FIG. 6 depicts illustrations of an example scenario for generating, using graph-based techniques, a compressed list of compound impression data records associated with a particular consumer in accordance with some embodiments discussed herein; FIG. 7A illustrates the compressed representation of the set of exemplary impression records previously described with reference to FIG. 6 in accordance with some embodiments discussed herein;

FIG. 7B depicts an example that illustrates the steps of a second example method for compressing impression data using graph-based techniques in accordance with some embodiments discussed herein;

FIG. 8 is a flow diagram of an example method for multi-dimensional compressing of a set of impression data records using graphical techniques in accordance with some embodiments discussed herein;

FIG. 9 is a flow diagram of an example method for retrieving a set of consumer behavior data records that were compressed using graph-based techniques in response to receiving a query in accordance with some embodiments discussed herein; and FIG. 10 illustrates a schematic block diagram of circuitry that can be included in a computing device, such as a data record compression module, in accordance with some embodiments discussed herein.

DETAILED DESCRIPTION

The present invention now will be described more fully hereinafter with reference to the accompanying drawings, in which some, but not all embodiments of the invention are shown. Indeed, this invention may be embodied in many different forms and should not be construed as being limited to the embodiments set forth herein; rather, these embodiments are provided so that this disclosure will satisfy applicable legal requirements. Like numbers refer to like elements throughout.

As described herein, system components can be communicatively coupled to one or more of each other. Though the components are described as being separate or distinct, two or more of the components may be combined into a single process or routine. The component functional descriptions provided herein including separation of responsibility for distinct functions is by way of example. Other groupings or other divisions of functional responsibilities can be made as necessary or in accordance with design preferences.

Glossary

As used herein, the terms "data," "content," "information" and similar terms may be used interchangeably to refer to data capable of being captured, transmitted, received, displayed and/or stored in accordance with various example embodiments. Thus, use of any such terms should not be taken to limit the spirit and scope of the disclosure. Further, where a computing device is described herein to receive data from another computing device, the data may be received directly from the another computing device or may be received indirectly via one or more intermediary computing devices, such as, for example, one or more servers, relays, routers, network access points, base stations, and/or the like. Similarly, where a computing device is described herein to send data to another computing device, the data may be sent directly to the another computing device or may be sent indirectly via one or more intermediary computing devices, such as, for example, one or more servers, relays, routers, network access points, base stations, and/or the like.

As used herein, the term "promotion and marketing service" may refer, without limitation, to a service that is accessible via one or more computing devices and is operable to provide example promotion and/or marketing services on behalf of one or more providers that are offering one or more instruments that are redeemable for goods, services, experiences and/or the like. The promotion and marketing service is further configured to illustrate or otherwise inform one or more consumers of the availability of one or more instruments in the form of one or more impressions. In some examples, the promotion and marketing service may also take the form of a redemption authority, a payment processor, a rewards provider, an entity in a financial network, a promoter, an agent and/or the like. As such, the service is, in some example embodiments, configured to present one or more promotions via one or more impressions, accept payments for promotions from consumers, issue instruments upon acceptance of an offer, participate in redemption, generate rewards, provide a point of sale device or service, issue payments to providers and/or or otherwise participate in the exchange of goods, services or experiences for currency, value and/or the like.

As used herein, the term "provider" may be used to refer, without limitation, to a merchant, business owner, consigner, shopkeeper, tradesperson, vender, operator, entrepreneur, agent, dealer, organization or the like that is in the business of a providing a good, service or experience to a consumer, facilitating the provision of a good, service or experience to a consumer and/or otherwise operating in the stream of commerce. For example, a provider may be in the form of a running company that sells attire that is generally used by a person who runs or participates in athletic activities.

As used herein, the terms "promotion," "offer," "deal" and similar terms may be used interchangeably to refer, without limitation, to any type of offered, presented or otherwise indicated reward, discount, coupon, credit, incentive, discount, media or the like that is indicative of a promotional value or the like that upon purchase or acceptance results in the issuance of an instrument that may be used toward at least a portion of the purchase of particular goods, services and/or experiences defined by the promotion. An example promotion, using the aforementioned running company as the example provider, is $25 for $50 toward running shoes. In some examples, the promotion defines an accepted value (e.g., a cost to purchase the promotion), a promotional value (e.g., the value of the resultant instrument beyond the accepted value), a residual value (e.g., the value upon return or upon expiry of one or more redemption parameters), one or more redemptions parameters and/or the like. For example, and using the running company promotion as an example, the accepted value is $25 and the promotional value is $50. In this example, the residual value may be equal to the accepted value.

As used herein, the term "instrument" may be used, without limitation, to refer to any type of gift card, tender, electronic certificate, medium of exchange, voucher, or the like that embodies the terms of the promotion from which the instrument resulted and may be used toward at least a portion of the purchase, acquisition, procurement, consumption or the like of goods, services and/or experiences. In some examples, the instrument may take the form of tender that has a given value that is exchangeable for goods, services and/or experiences and/or a reduction in a purchase price of a particular good, service or experience. In some examples, the instrument may have multiple values, such as accepted value, a promotional value and/or a residual value. For example, using the aforementioned running company as the example provider, an electronic indication in a mobile application that shows $50 of value to spend at the running company. In some examples, the accepted value of the instrument is defined by the value exchanged for the instrument. In some examples, the promotional value is defined by the promotion from which the instrument resulted and is the value of the instrument beyond the accepted value. In some examples, the residual value is the value after redemption, the value after the expiry or other violation of a redemption parameter, the return or exchange value of the instrument and/or the like.

As used herein, the term "impression" may be used, without limitation, to refer to a communication, a display, or other perceived indication, such as a flyer, print media, e-mail, text message, application alert, mobile applications, other type of electronic interface or distribution channel and/or the like, of one or more promotions. For example, and using the aforementioned running company as the example provider, an e-mail communication sent to consumers that indicates the availability of a $25 for $50 toward running shoes promotion.

As used herein, the terms "consumer" and "customer" may be used interchangeably to refer, without limitation, to a client, customer, purchaser, shopper, user or the like who may be in the position to or does exchange value for one or more instruments under the terms defined by the one or promotions. For example, and using the aforementioned running company as the example provider, an individual who is interested in purchasing running shoes.

TECHNICAL UNDERPINNINGS AND IMPLEMENTATION OF EXEMPLARY EMBODIMENTS

Figure 1:
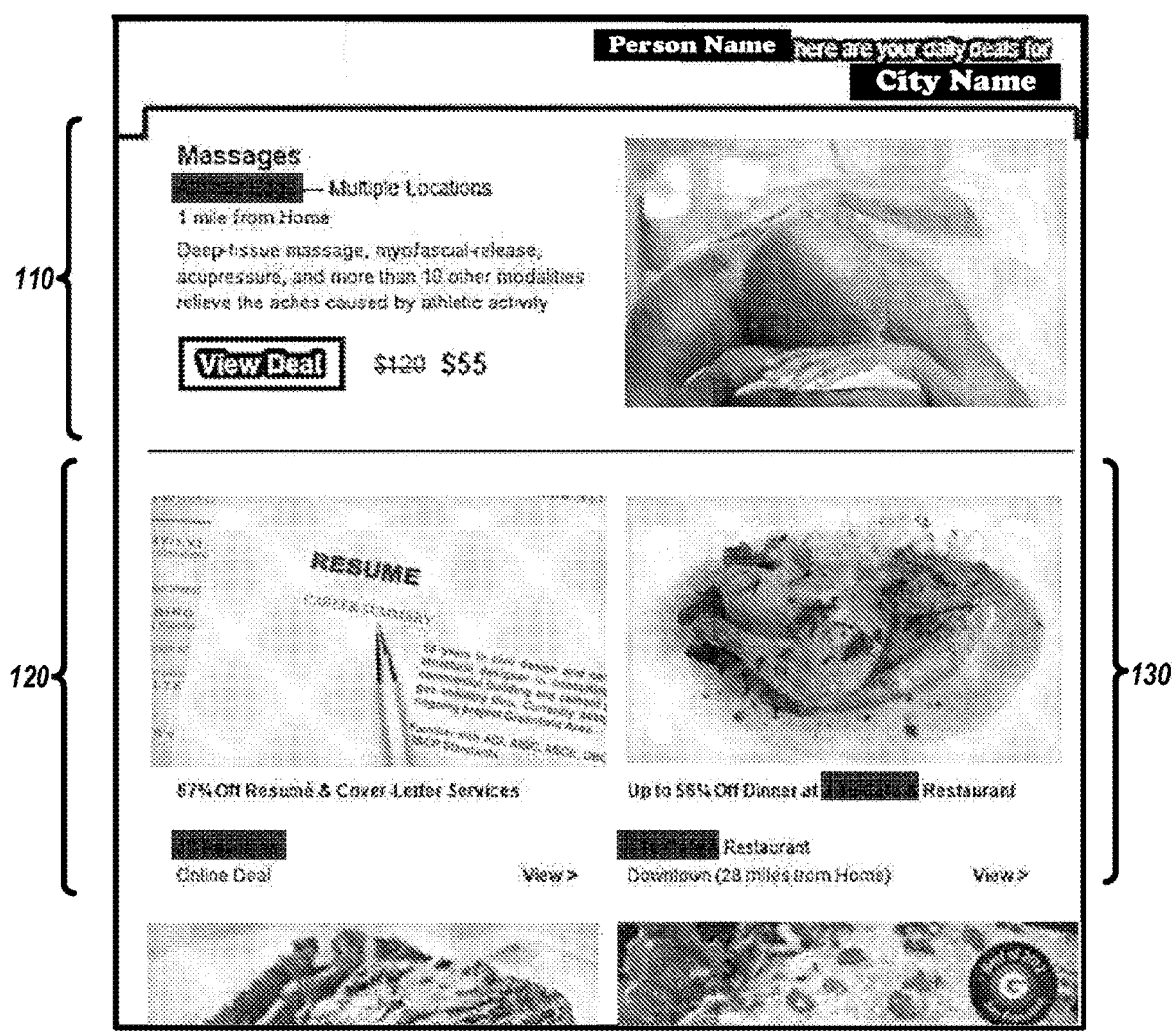
FIG. 1 illustrates an example email impression 100 that has been sent from a promotion provider to a particular recipient in accordance with some embodiments discussed herein.

FIG. 1 illustrates an example email impression 100 that has been sent from a promotion provider to a particular recipient (Person Name in this example) who is at a particular location (City Name in this example). The email content includes a set of graphics (110, 120, and 130), each graphic respectively representing a promotion that is available for purchase. Each of the graphics can include images and other descriptive material about a promotion (a "deal" in this example). Each graphic also can include an active link widget. In response to selection of an active link widget, the recipient can be directed (e.g., via a browser) to the promotion and marketing service's website where the recipient can examine additional details about and finalize a purchase of the promotion associated with the widget.

In embodiments, an impression 100 can have a custom configuration based on a ranking of the promotions identified as relevant to the recipient. Referring to example 100, the graphic that is displayed at the very top of the layout (i.e., the massages promotion 110) can represent a featured deal. In some embodiments, the featured deal 110 is the promotion that has been ranked as the promotion most likely to be of interest to the recipient, and its position in the layout of graphics is designed to emphasize this particular portion of the impression content to the recipient. In addition to being displayed alone at the top of the display (and thus most likely to be the first thing to be read by the recipient), the featured deal 110 graphic and its active link widget are rendered to be larger and thus more prominent.

Figure 2:
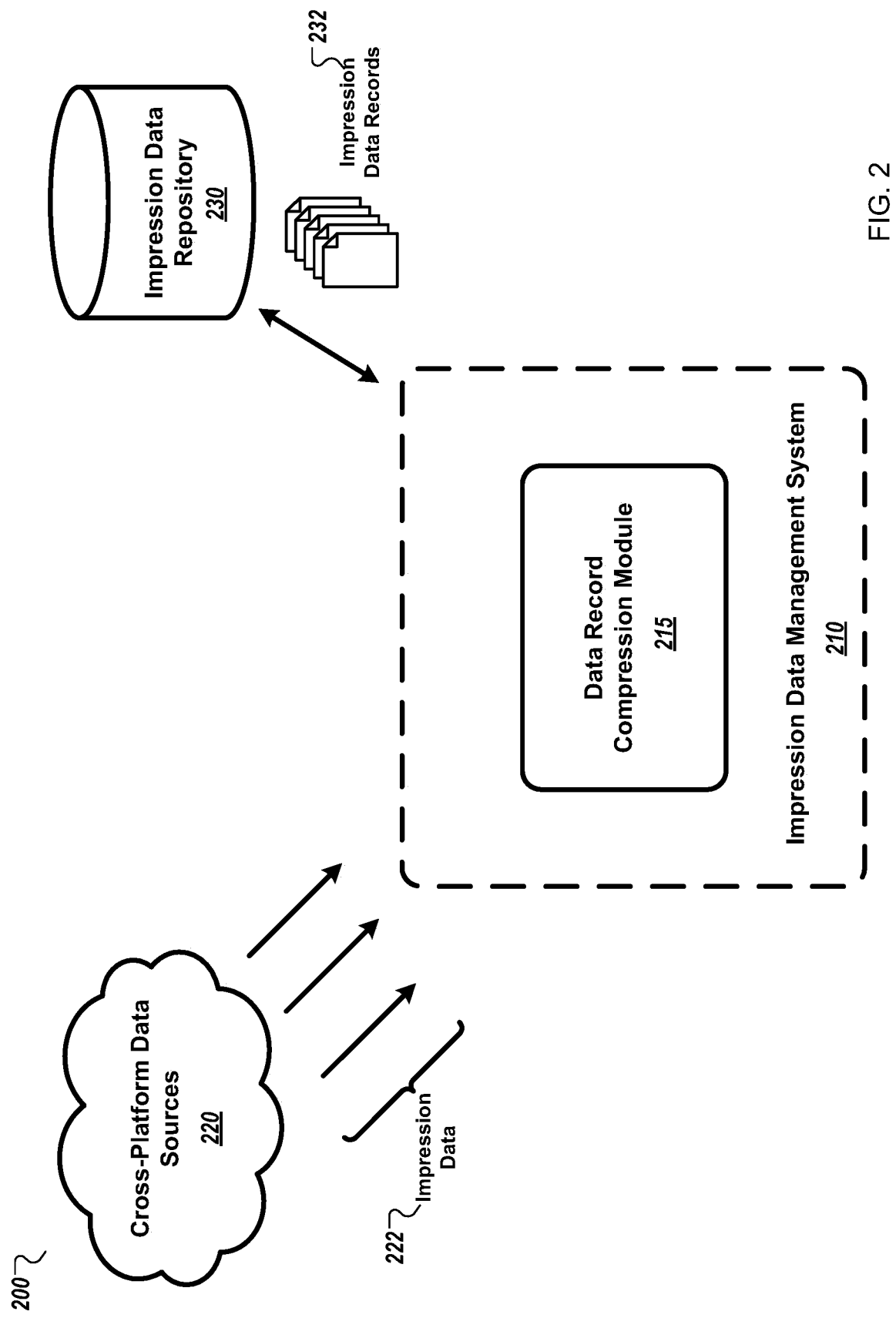
FIG. 2 illustrates an example system that can be configured to implement collecting and storing of impression data in accordance with some embodiments discussed herein.

FIG. 2 illustrates an example system 200 that can be configured to implement collecting and storing of impression data. In some embodiments, a promotion and marketing service will collect and record data each time that a consumer interacts with content published by the promotion and marketing service. Impression data 222 may be collected from at least one data stream received by an impression data management system 210 from cross-platform data sources 220 representing instances of consumer engagement with the published content (e.g., instances in which a consumer opens a mobile application, clicks on and/or opens an email, and/or visits a website), and consumer activation state (e.g., instances in which a consumer makes a promotion purchase).

In embodiments, impression data management system may generate impression data records 232 using the collected impression data 222; in some embodiments, each data record respectively represents an instance of a particular consumer's interaction with the content of a particular impression. The generated impression data records are stored in an impression data repository 230. For a promotion and marketing service, the stored impression data are valuable marketing data, and the impression data repository 130 is a very large data repository. The storage, maintenance, and access of data within a large data repository represent a challenge.

In some embodiments, impression data management system 210 includes a data record compression module 215 for compressing the generated impression data records 232. Compressing data records will improve storage efficiency (e.g., compressed records can be packed more densely and thus maximize available storage capacity) and, additionally and/or alternatively, compressing data records will improve data access because more smaller-sized records may be held simultaneously in memory; in-memory data access is faster and more efficient because the additional I/O computing costs are eliminated. In some embodiments, data compression module 215 implements graph-based compression techniques to compress impression data records 232.

Figure 3:
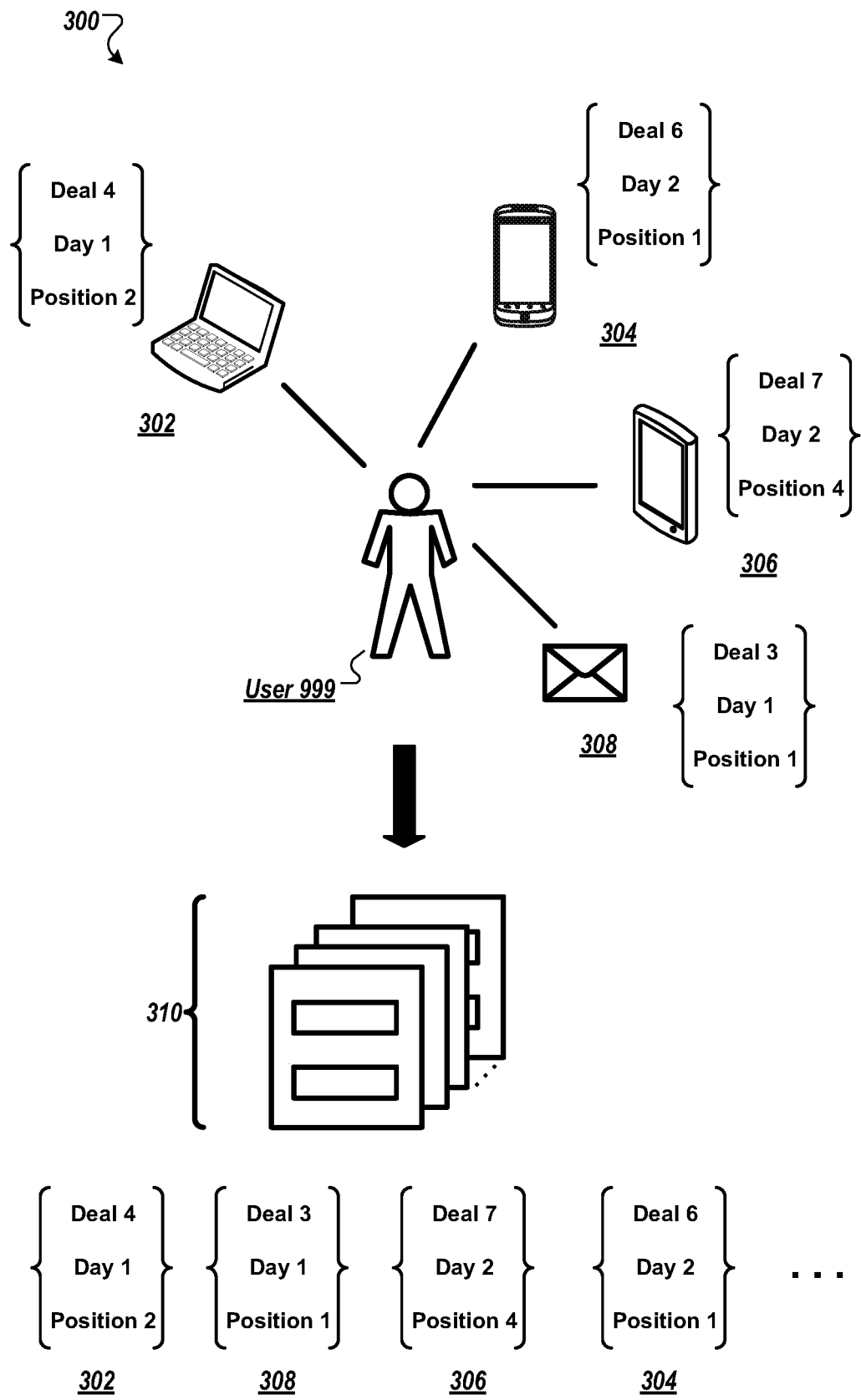
FIG. 3 illustrates an example scenario in which a set of generated impression data records represent a sequence of the interactions of a particular user with a set of impressions during a time period having a duration of several days in accordance with some embodiments discussed herein.

FIG. 3 illustrates an example scenario 300 in which a set of generated impression data records represent a sequence of the interactions of a particular user with a set of impressions during a time period having a duration of several days. This example is presented for clarity and not for limitation of the invention.

In the example, the particular user, having user ID 999, has interacted with content in impressions presented during the time period on a variety of devices: a website via a laptop computer browser 302, a mobile phone app 304, a tablet app 306, and an email 308. A set of impression records 310 has been generated that each respectively represents an interaction instance. Each impression data record contains multiple components, each representing an attribute of the interaction: An identifier of the promotion content with which the consumer interacted; the day within the time period on which the interaction occurred; and the position of the promotion content within the layout of the impression presentation.

Figure 4:
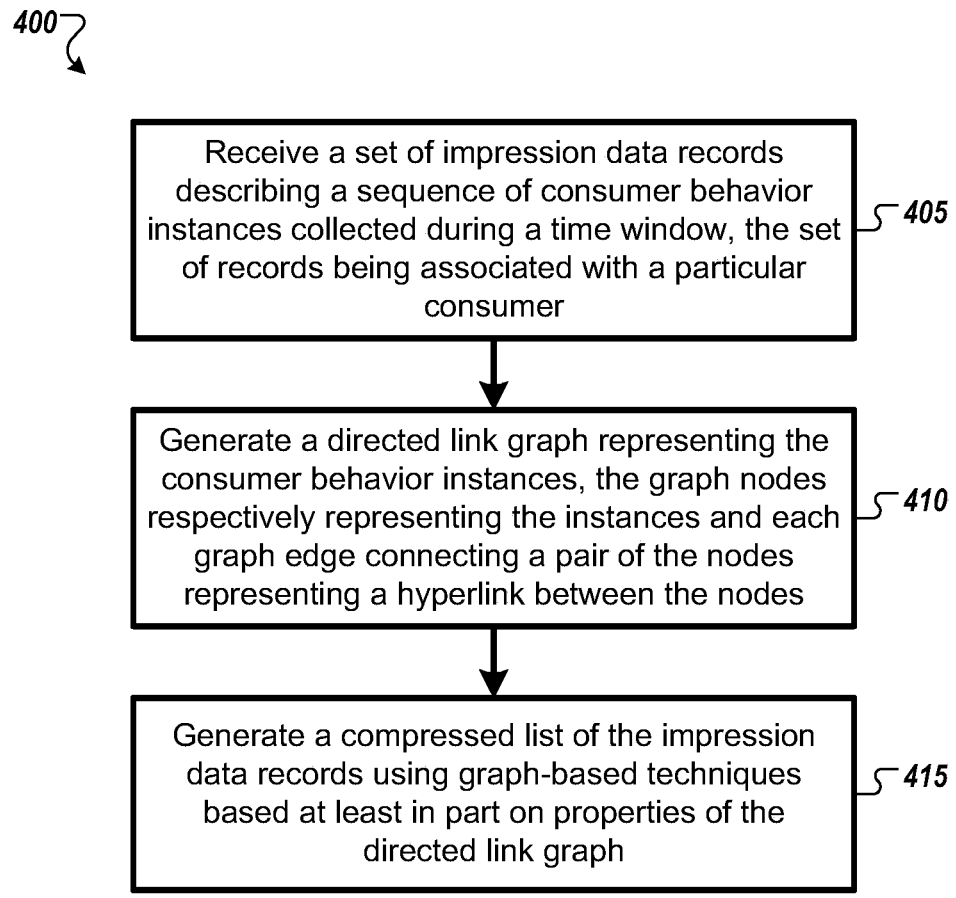
FIG. 4 is a flow diagram of a first example method for compressing a set of impression data records using graphical techniques in accordance with some embodiments discussed herein.

FIG. 4 is a flow diagram of a first example method 400 for compressing a set of impression data records using graphical techniques. For convenience, the method 400 will be described with respect to a system that includes one or more computing devices and performs the method 400. Specifically, the method 400 will be described with respect to processing of impression data records by data record compression module 215.

In embodiments, the system receives 405 a set of impression data records associated with a particular consumer. In some embodiments, the set of impression data records describes a sequence of consumer behavior instances collected during a time window and each impression data record is a compound data record including multiple data components, as previously described with reference to example 300.

In embodiments, the system generates 410 a directed link graph (i.e., a webgraph in which the edges are associated with a direction) in which the graph nodes respectively represent the consumer behavior instances and each of the edges connecting a pair of nodes represents a hyperlink between the nodes.

In embodiments, the system generates 415 a compressed list of the impression data records using graph-based techniques based at least in part on properties of the directed link graph.

Figure 5:
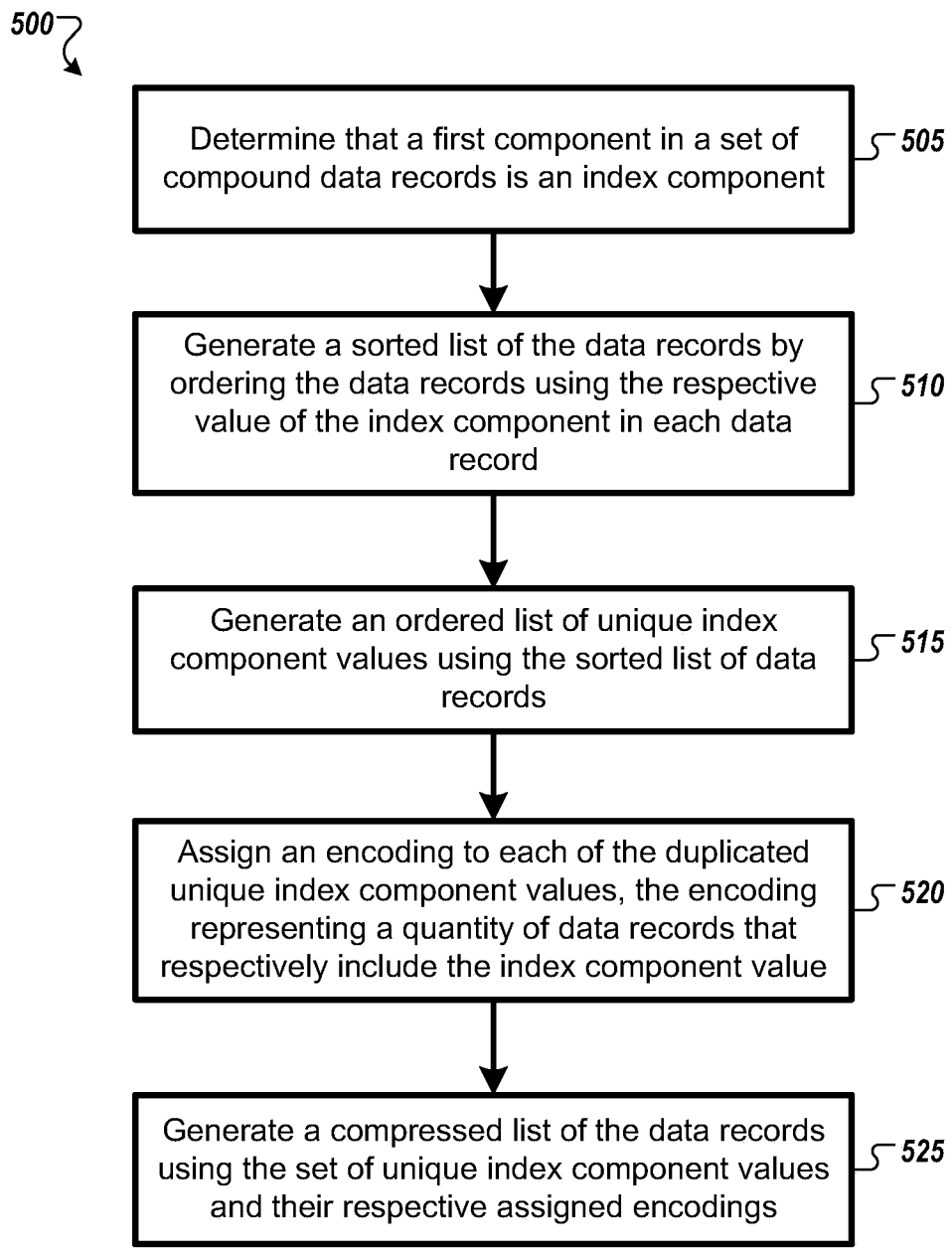
FIG. 5 is a flow diagram of an example method for generating a compressed list of compound data records using graph-based techniques in accordance with some embodiments discussed herein.

FIG. 5 is a flow diagram of an example method 500 for generating a compressed list of compound data records using graph-based techniques. For convenience, the method 500 will be described with respect to a system that includes one or more computing devices and performs the method 500. Specifically, the method 500 will be described with respect to the implementation of step 415 in method 400.

FIG. 6 is illustrations, presented for clarity and not for limitation, of an example scenario for generating, using graph-based techniques, a compressed list of compound impression data records associated with a particular consumer.

In embodiments, the system determines 505 that a first component in the data records will be an index component. In some embodiments, the determination of which component is an index component is based on determining the component that is associated with the largest amount of different values. Referencing FIG. 6, example 600A illustrates a list of compound impression data records representing a sequence of consumer behavior instances associated with a particular consumer (User 999) and collected within a particular time period, each record being composed of 3 components: Deal ID (Component 1); Day within the time period on which the interaction occurred (Component 2); and Position of the promotion content within the layout of the impression presentation (Component 3). In the example, Component 1 is determined to be the index component because is associated with the largest amount of different values.

In embodiments, the system generates 510 a sorted list of the data records by ordering the data records using the respective value of the index component in each data record. Example 600B represents the sorted list of impression data records, ordered based on their respective values for Component 1.

The lists in examples 600A and 600B include records with duplicate values for the index component, the duplicates representing multiple consumer behavior instances during the time period in which User 999 interacted with an impression of a particular deal (e.g., Deal 3 and Deal 5). As illustrated in Example 600C, in embodiments, the system generates 515 an ordered list of unique index component values and assigns each a position identifier.

In embodiments, the system assigns 520 an encoding to each of the duplicated unique index component values, the encoding representing a quantity of data records that respectively include the index component value. This encoding represents a reference compression technique that exploits link graph properties of locality and similarity as discussed, for example, in Boldi, Paolo and Sebastiano Vigna. The WebGraph framework I: Compression techniques. In *Proc. of the Thirteenth International World Wide Web Conference* (*WWW* 2004), pages 595-601, Manhattan, USA, 2004. ACM Press. The property of locality states that if links are sorted lexicographically, the index of source and target are close to each other. The property of similarity states that nodes that are close to each other (in lexicographic order) tend to have many common successors.

In some embodiments, the system generates 525 a compressed list of the data records using the set of unique index component values and their respective assigned encodings.

FIG. 7A illustrates the compressed representation 700 of the set of exemplary impression records previously described with reference to FIG. 6. The compressed representation of the set of records is a table entry keyed to the consumer identifier associated with the set of records. In the table entry, each row represents one of the record's data components, while each column respectively describes attributes of the distribution of values of the component within the set. For example, the row describing the index component, Component 1, includes the ordered list of unique values (as illustrated in Example 600C) and encodings associated with each duplicated value that describe the repetitions of the value. As previously described, Deal 3 (position 0 in the sorted list) has 2 repetitions; thus its associated encoding is (0,2). Deal 5 (position 2 in the sorted list) has 2 repetitions; thus its associated encoding is (2,2).

In some embodiments, a set of compound impression data records may be compressed based only on one dimension represented by the index value (e.g., using the set of unique index component values and their respective assigned encodings as described with reference to method 500). In some alternative embodiments, a set of compound impression data may be compressed further based on multiple dimensions, each of which represents duplication distribution of values in additional non-index data record components.

FIG. 7B depicts an example that illustrates the steps of a second example method for compressing impression data using graphical techniques. The second example method uses delta encoding, which exploits link graph properties as described, for example, in Boldi and Vigna, 2004. For convenience, the second example method will be described with respect to a system that includes one or more computing devices and performs the second example method.

In embodiments, the system receives an unsorted list of link graph node values to be compressed, and generates a sorted list of unique index values from the list as described previously, for example, with reference to Example 600C.

In embodiments, the system generates an index value list by replacing each of the unsorted list values with their respective unique index value list position.

In embodiments, the system generates an encoded index value list by calculating an encoded value for each list element. In embodiments, generating an encoded index value includes subtracting a value from the previous value in the list. If the difference is positive, multiply the difference by 2. If the difference is negative, multiply its mod by 2 and subtract 2.

In embodiments, the system compresses the encoded index value using Elias delta encoding, which is a known universal code for positive integers that is described, for example, at http://en.wikipedia.org/wiki/Elias_delta_coding. A universal code is used for compression of numeric value, and is a prefix code that maps positive integers onto binary codewords.

FIG. 8 is a flow diagram of an example method 800 for multi-dimensional compressing of a set of impression data records using graphical techniques. For convenience, the method 800 will be described with respect to a system that includes one or more computing devices and performs the method 800. Specifically, the method 500 will be described with respect to the implementation of step 525 in method 500.

In embodiments, the system receives 805 a list of compound data records, ordered using an index component of each data record as was implemented, for example in step 510 of method 500 and illustrated in example 600B. Each data record includes a second component (e.g., Component 2 in example 600A) that is different from the index component.

In embodiments, the system identifies 810 a set of unique second component values within the sorted list of data records. In embodiments, the system identifies 815, for each unique second component value, a list of positions of data records within the sorted list of compound data records that include the unique second component value.

In embodiments, the system generates 820 a second encoding by associating the second component with the set of unique second component values and their respective associated lists of data record positions.

Referencing example 700, the row describing the second component, Component 2, includes the ordered list of the second component's unique values (as illustrated in Example 600C) and respective lists of data record positions in the sorted data record list for records containing each unique second component value (e.g., unique Component 2 value 1 is contained in records in position 0, 2, and 3 in the sorted data record list).

In embodiments, method 800 may be implemented repeatedly to further compress compound data records based on multiple dimensions representing one or more of the additional non-index components in the data records. Example 700, representing an exemplary 3 dimensional compression, includes a third encoding using the unique values identified for Component 3.

In embodiments, the improved compression achieved using graph-based techniques enables faster, more efficient querying of data stored in large data repository (e.g., impression data repository 230). The smaller size of the compressed data enables larger amounts of stored data to be retrieved in one I/O access, facilitating establishment of an in-memory "user cache" for processing a variety of queries without the necessity of multiple I/O operations for retrieving additional stored data.

FIG. 9 is a flow diagram of an example method 900 for retrieving a set of consumer behavior data records that were compressed using graph-based techniques in response to receiving a query. For convenience, the method 900 will be described with respect to a system that includes one or more computing devices and performs the method 900. Specifically, the method 500 will be described with respect to query processing by impression data management system 210.

In embodiments, the system receives 905 a query including search terms that include a unique identifier associated with a particular consumer. In response to receiving the query, the system retrieves 910 a stored compressed set of consumer behavior data records that have been generated based on properties of a directed link graph representation of the set of data records.

In embodiments, the system identifies 915 a subset of the consumer behavior data records associated with the particular consumer using the unique identifier. In some embodiments, a compressed set of data records (e.g., the compressed set of records illustrated in Example 700) may be stored as an array of bytes, and identifying the subset of the impression data records associated with the particular consumer includes determining an offset location in the array of bytes using the unique identifier associated with the particular consumer and unpacking a segment of the array of bytes beginning at the offset location. In some embodiments, impression data management system 210 includes a key/value store wrapper (e.g., a hash map structure) in which the key is the consumer identifier and the value is the offset within a byte array at which a list of compressed tables representing behavior of that consumer are stored. In some embodiments, an impression data repository 230 is a parallel distributed data store (e.g., Hadoop), and the system uses parallel retrieval methods (e.g., MapReduce) for identifying the subset of data records associated with the consumer.

In embodiments, the system uncompresses 920 the retrieved subset of consumer behavior data records. In some embodiments in which the compressed data records are compound data records that have been compressed using multi-dimensional encodings (e.g., the compressed set of records illustrated in Example 700), the data records may have been further indexed and the system may be able to use the indexing to uncompress selected portions of the retrieved subset of consumer behavior data records.

FIG. 10 shows a schematic block diagram of circuitry 1000, some or all of which may be included in, for example, impression data system 200. As illustrated in FIG. 10, in accordance with some example embodiments, circuitry 1000 can include various means, such as processor 1002, memory 1004, communications module 1006, and/or input/output module 1008. As referred to herein, "module" includes hardware, software and/or firmware configured to perform one or more particular functions. In this regard, the means of circuitry 1000 as described herein may be embodied as, for example, circuitry, hardware elements (e.g., a suitably programmed processor, combinational logic circuit, and/or the like), a computer program product comprising computer-readable program instructions stored on a non-transitory computer-readable medium (e.g., memory 1004) that is executable by a suitably configured processing device (e.g., processor 1002), or some combination thereof.

Processor 1002 may, for example, be embodied as various means including one or more microprocessors with accompanying digital signal processor(s), one or more processor(s) without an accompanying digital signal processor, one or more coprocessors, one or more multi-core processors, one or more controllers, processing circuitry, one or more computers, various other processing elements including integrated circuits such as, for example, an ASIC (application specific integrated circuit) or FPGA (field programmable gate array), or some combination thereof. Accordingly, although illustrated in FIG. 10 as a single processor, in some embodiments, processor 1002 comprises a plurality of processors. The plurality of processors may be embodied on a single computing device or may be distributed across a plurality of computing devices collectively configured to function as circuitry 1000. The plurality of processors may be in operative communication with each other and may be collectively configured to perform one or more functionalities of circuitry 1000 as described herein. In an example embodiment, processor 1002 is configured to execute instructions stored in memory 1004 or otherwise accessible to processor 1002. These instructions, when executed by processor 1002, may cause circuitry 1000 to perform one or more of the functionalities of circuitry 1000 as described herein.

Whether configured by hardware, firmware/software methods, or by a combination thereof, processor 1002 may comprise an entity capable of performing operations according to embodiments of the present invention while configured accordingly. Thus, for example, when processor 1002 is embodied as an ASIC, FPGA or the like, processor 1002 may comprise specifically configured hardware for conducting one or more operations described herein. Alternatively, as another example, when processor 1002 is embodied as an executor of instructions, such as may be stored in memory 1004, the instructions may specifically configure processor 1002 to perform one or more algorithms and operations described herein, such as those discussed in connection with FIGS. 4, 5, 8, and 9.

Memory 1004 may comprise, for example, volatile memory, non-volatile memory, or some combination thereof. Although illustrated in FIG. 10 as a single memory, memory 1004 may comprise a plurality of memory components. The plurality of memory components may be embodied on a single computing device or distributed across a plurality of computing devices. In various embodiments, memory 1004 may comprise, for example, a hard disk, random access memory, cache memory, flash memory, a compact disc read only memory (CD-ROM), digital versatile disc read only memory (DVD-ROM), an optical disc, circuitry configured to store information, or some combination thereof. Memory 1004 may be configured to store information, data (including analytics data), applications, instructions, or the like for enabling circuitry 1000 to carry out various functions in accordance with example embodiments of the present invention. For example, in at least some embodiments, memory 1004 is configured to buffer input data for processing by processor 1002. Additionally or alternatively, in at least some embodiments, memory 1004 is configured to store program instructions for execution by processor 1002. Memory 1004 may store information in the form of static and/or dynamic information. This stored information may be stored and/or used by circuitry 1000 during the course of performing its functionalities.

Communications module 1006 may be embodied as any device or means embodied in circuitry, hardware, a computer program product comprising computer readable program instructions stored on a computer readable medium (e.g., memory 1004) and executed by a processing device (e.g., processor 1002), or a combination thereof that is configured to receive and/or transmit data from/to another device, such as, for example, a second circuitry 1000 and/or the like. In some embodiments, communications module 1006 (like other components discussed herein) can be at least partially embodied as or otherwise controlled by processor 1002. In this regard, communications module 1006 may be in communication with processor 1002, such as via a bus. Communications module 1006 may include, for example, an antenna, a transmitter, a receiver, a transceiver, network interface card and/or supporting hardware and/or firmware/software for enabling communications with another computing device. Communications module 1006 may be configured to receive and/or transmit any data that may be stored by memory 1004 using any protocol that may be used for communications between computing devices. Communications module 1006 may additionally or alternatively be in communication with the memory 1004, input/output module 1008 and/or any other component of circuitry 1000, such as via a bus.

Input/output module 1008 may be in communication with processor 1002 to receive an indication of a user input and/or to provide an audible, visual, mechanical, or other output to a user. Some example visual outputs that may be provided to a user by circuitry 1000 are discussed in connection with FIG. 1. As such, input/output module 1008 may include support, for example, for a keyboard, a mouse, a joystick, a display, a touch screen display, a microphone, a speaker, a RFID reader, barcode reader, biometric scanner, and/or other input/output mechanisms. In embodiments wherein circuitry 1000 is embodied as a server or database, aspects of input/output module 1008 may be reduced as compared to embodiments where circuitry 1000 is implemented as an end-user machine or other type of device designed for complex user interactions. In some embodiments (like other components discussed herein), input/output module 1008 may even be eliminated from circuitry 1000. Alternatively, such as in embodiments wherein circuitry 1000 is embodied as a server or database, at least some aspects of input/output module 1008 may be embodied on an apparatus used by a user that is in communication with circuitry 1000. Input/output module 1008 may be in communication with the memory 1004, communications module 1006, and/or any other component(s), such as via a bus. Although more than one input/output module and/or other component can be included in circuitry 1000, only one is shown in FIG. 10 to avoid overcomplicating the drawing (like the other components discussed herein).

Data record compression module 1010 may also or instead be included and configured to perform the functionality discussed herein related to the data record compression discussed above. In some embodiments, some or all of the functionality of data record compression may be performed by processor 1002. In this regard, the example processes and algorithms discussed herein can be performed by at least one processor 1002 and/or data record compression module 1010. For example, non-transitory computer readable media can be configured to store firmware, one or more application programs, and/or other software, which include instructions and other computer-readable program code portions that can be executed to control each processor (e.g., processor 1002 and/or data record compression module 1010) of the components of system 200 to implement various operations, including the examples shown above. As such, a series of computer-readable program code portions are embodied in one or more computer program products and can be used, with a computing device, server, and/or other programmable apparatus, to produce machine-implemented processes.

Any such computer program instructions and/or other type of code may be loaded onto a computer, processor or other programmable apparatus's circuitry to produce a machine, such that the computer, processor other programmable circuitry that execute the code on the machine create the means for implementing various functions, including those described herein.

It is also noted that all or some of the information presented by the example displays discussed herein can be based on data that is received, generated and/or maintained by one or more components of system 200. In some embodiments, one or more external systems (such as a remote cloud computing and/or data storage system) may also be leveraged to provide at least some of the functionality discussed herein.

As described above in this disclosure, aspects of embodiments of the present invention may be configured as methods, mobile devices, backend network devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Any suitable computer-readable storage medium may be utilized including non-transitory hard disks, CD-ROMs, flash memory, optical storage devices, or magnetic storage devices.

Embodiments of the present invention have been described above with reference to block diagrams and flowchart illustrations of methods, apparatuses, systems and computer program products. It will be understood that each block of the circuit diagrams and process flow diagrams, and combinations of blocks in the circuit diagrams and process flowcharts, respectively, can be implemented by various means including computer program instructions. These computer program instructions may be loaded onto a general purpose computer, special purpose computer, or other programmable data processing apparatus, such as processor 1002 and/or data record compression module 1010 discussed above with reference to FIG. 10, to produce a machine, such that the computer program product includes the instructions which execute on the computer or other programmable data processing apparatus create a means for implementing the functions specified in the flowchart block or blocks.

These computer program instructions may also be stored in a computer-readable storage device (e.g., memory 1004) that can direct a computer or other programmable data processing apparatus to function in a particular manner, such that the instructions stored in the computer-readable storage device produce an article of manufacture including computer-readable instructions for implementing the function discussed herein. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions discussed herein.

Accordingly, blocks of the block diagrams and flowchart illustrations support combinations of means for performing the specified functions, combinations of steps for performing the specified functions and program instruction means for performing the specified functions. It will also be understood that each block of the circuit diagrams and process flowcharts, and combinations of blocks in the circuit diagrams and process flowcharts, can be implemented by special purpose hardware-based computer systems that perform the specified functions or steps, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A system comprising a processor and memory storing computer-readable program code configured to cause, when executed by the processor, the system to:
   receive a query comprising search terms, wherein the search terms include a unique identifier associated with a consumer;
   in response to receipt of the query, retrieve a stored compressed consumer impression data records set, wherein the stored compressed consumer impression data records set was generated based on properties of a directed link graph representation of the stored compressed consumer impression data records set, and
   identify a consumer impression data records subset associated with the consumer based on the unique identifier; and
   uncompress the consumer impression data records subset.

2. The system of claim 1, wherein the stored compressed consumer impression data records set is an array of bytes.

3. The system of claim 2, wherein the computer-readable program code is further configured to cause, when executed by the processor, the system to:
   determine an offset location in the array of bytes based on the unique identifier associated with the consumer;
   unpack a segment of the array of bytes beginning at the offset location; and
   identify the consumer impression data records subset associated with the consumer based on the unpacked segment of the array of bytes.

4. The system of claim 3, wherein the offset location is a first offset location, wherein each consumer impression data record in the stored compressed consumer impression data records set comprises at least two components, wherein the search terms comprise a component identifier associated with a component, and wherein the computer-readable program code is further configured to cause, when executed by the processor, the system to:
   determining a second offset location in the array of bytes based on the component identifier, wherein the second offset location is within the segment of the array of bytes beginning at the first offset location; and
   unpack the segment of the array of bytes beginning at the second offset location.

5. The system of claim 1, wherein the stored compressed consumer impression data records set comprises consumer impression data records describing consumer behavior instances associated with the consumer collected during a time window.

6. The system of claim 5, wherein the directed link graph representation of the stored compressed consumer impression data records set comprises graph nodes and graph edges, wherein the graph nodes respectively represent the consumer behavior instances, and wherein each of the graph edges respectively represents a hyperlink between a pair of the graph nodes.

7. The system of claim 5, wherein the computer-readable program code is further configured to cause, when executed by the processor, the system to:
   identify the consumer impression data records subset associated with the consumer based on a key/value store wrapper comprising a key and a value, wherein the key is the unique identifier, and wherein the value is an offset within a byte array at which a list of compressed tables representing the consumer behavior instances are stored.

8. The system of claim 7, wherein the key/value store wrapper is a hash map structure.

9. The system of claim 1, wherein the stored compressed consumer impression data records set is stored in a parallel distributed data store, and wherein the computer-readable program code is further configured to cause, when executed by the processor, the system to:
   identify the consumer impression data records subset based on a parallel retrieval technique.

10. A computer-implemented method comprising:
    receiving a query comprising search terms, wherein the search terms include a unique identifier associated with a consumer;
    in response to receiving the query, retrieving a stored compressed consumer impression data records set, wherein the stored compressed consumer impression data records set was generated based on properties of a directed link graph representation of the stored compressed consumer impression data records set, and
    identifying a consumer impression data records subset associated with the consumer based on the unique identifier; and
    uncompressing the consumer impression data records subset.

11. The computer-implemented method of claim 10, wherein the stored compressed consumer impression data records set is an array of bytes.

12. The computer-implemented method of claim 11, wherein identifying the consumer impression data records subset associated with the consumer further comprises:
    determining an offset location in the array of bytes based on the unique identifier associated with the consumer; and
    unpacking a segment of the array of bytes beginning at the offset location.

13. The computer-implemented method of claim 12, wherein the offset location is a first offset location, wherein each consumer impression data record in the stored compressed consumer impression data records set comprises at least two components, wherein the search terms comprise a component identifier associated with a component, and wherein unpacking the segment of the array of bytes further comprises:
    determining a second offset location in the array of bytes based on the component identifier, wherein the second offset location is within the segment of the array of bytes beginning at the first offset location; and
    unpacking the segment of the array of bytes beginning at the second offset location.

14. The computer-implemented method of claim 10, wherein the stored compressed consumer impression data records set comprises consumer impression data records describing consumer behavior instances associated with the consumer collected during a time window.

15. The computer-implemented method of claim 14, wherein the directed link graph representation of the stored compressed consumer impression data records set comprises graph nodes and graph edges, wherein the graph nodes respectively represent the consumer behavior instances, and wherein each of the graph edges respectively represents a hyperlink between a pair of the graph nodes.

16. The computer-implemented method of claim 14, wherein identifying the consumer impression data records subset associated with the consumer further comprises:
   identifying the consumer impression data records subset associated with the consumer based on a key/value store wrapper comprising a key and a value, wherein the key is the unique identifier, and wherein the value is an offset within a byte array at which a list of compressed tables representing the consumer behavior instances are stored.

17. The computer-implemented method of claim 16, wherein the key/value store wrapper is a hash map structure.

18. The computer-implemented method of claim 10, wherein the stored compressed consumer impression data records set is stored in a parallel distributed data store, and wherein the identifying the consumer impression data records subset comprises:
   identifying the consumer impression data records subset based on a parallel retrieval technique.

19. A computer program product comprising at least one non-transitory computer-readable storage medium storing computer-readable program code that, when executed by a computing apparatus, cause the computing apparatus to:
   receive a query comprising search terms, wherein the search terms include a unique identifier associated with a consumer;
   in response to receipt of the query, retrieve a stored compressed consumer impression data records set, wherein the stored compressed consumer impression data records set was generated based on properties of a directed link graph representation of the stored compressed consumer impression data records set, and
   identify a consumer impression data records subset associated with the consumer based on the unique identifier; and
   uncompress the consumer impression data records subset.

20. The computer program product of claim 19, wherein the stored compressed consumer impression data records set is an array of bytes.

\* \* \* \* \*